United States Patent
Carruthers et al.

(10) Patent No.: US 8,337,675 B2
(45) Date of Patent: Dec. 25, 2012

(54) METHOD OF PLASMA VAPOUR DEPOSITION

(75) Inventors: Mark Ian Carruthers, Newport (GB); Stephen Burgess, Ebbw Vale (GB); Anthony Wilby, Bristol (GB); Amit Rastogi, Newport (GB); Paul Rich, Wotton Under Edge (GB); Nicholas Rimmer, Oxford (GB)

(73) Assignee: SPTS Technologies Limited, Newport, Wales (GB)

( * ) Notice: Subject to any disclaimer, the term of this patent is extended or adjusted under 35 U.S.C. 154(b) by 301 days.

(21) Appl. No.: 12/693,464

(22) Filed: Jan. 26, 2010

(65) Prior Publication Data
US 2010/0187097 A1 Jul. 29, 2010

Related U.S. Application Data

(60) Provisional application No. 61/147,338, filed on Jan. 26, 2009.

(51) Int. Cl.
    C23C 14/34 (2006.01)
(52) U.S. Cl. ......... 204/192.17; 204/192.15; 204/192.12; 438/685; 438/686; 438/687

(58) Field of Classification Search ............. 204/192.15, 204/192.17, 192.3; 438/685, 686, 687
See application file for complete search history.

(56) References Cited

U.S. PATENT DOCUMENTS

| 5,928,480 A | 7/1999 | Leiphart |
| 6,193,855 B1 | 2/2001 | Gopalraja et al. |
| 7,294,574 B2 * | 11/2007 | Ding et al. ..................... 438/687 |
| 2003/0150713 A1 | 8/2003 | Kado |
| 2006/0030151 A1 | 2/2006 | Ding et al. |
| 2006/0169576 A1 | 8/2006 | Brown et al. |

FOREIGN PATENT DOCUMENTS

WO  WO 2004/053926 A3  6/2004

OTHER PUBLICATIONS

Koyanagi et al: "Effects of He on Cu film formation by rf sputtering" Vacuum Elsevier UK, vol. 51, No. 4, Dec. 1998, pp. 575-582.

* cited by examiner

*Primary Examiner* — Rodney McDonald
(74) *Attorney, Agent, or Firm* — Volentine & Whitt, PLLC

(57) ABSTRACT

A method induces plasma vapor deposition of metal into a recess in a workpiece. The method achieves re-sputtering of the metal at the base of the recess with a sputter gas by utilizing a mixture of Ar and He and/or Ne as the sputter gas with a ratio of He and/or Ne:Ar of at least about 10:1.

9 Claims, 8 Drawing Sheets

METHOD OF PLASMA VAPOUR DEPOSITION

A claim of priority is made to U.S. Provisional application No. 61/147,338, filed Jan. 26, 2009, the disclosure of which is incorporated herein in its entirety.

BACKGROUND

This invention relates to a method of plasma vapour deposition of metal into a recess in a workpiece in a manner to achieve re-sputtering of the metal at the base of the recess onto the sidewalls.

It is known to use ionised metal sputtering techniques involving a high powered unbalanced magnetron discharge source. The metal ions are attracted to the base of a recess formed in a workpiece, such as a semi-conductor wafer, using a DC bias induced by applying RF power to the wafer pedestal. This gives an improved bottom and sidewall coverage in the recess. Further improvement is known to be achievable by re-sputtering the metal already deposited in the base onto the lower and mid parts of the recess sidewall. To achieve re-sputtering DC bias voltages in the range of 50 to 500 volts are required. The higher the DC bias the greater re-sputtering and there is an improvement in the sidewall coverage.

Even so the current results are not satisfactory for all purposes.

SUMMARY

From one aspect the invention consists in a method of plasma vapour deposition in metal into a recess in a work piece in a manner to achieve re-sputtering of the metal at the base of the recess onto the side walls by sputtering a metal target with a sputter gas characterised in that the sputter gas is a mixture of Ar and He when the ratio He:Ar is at least about 10:1.

Preferably the ratio is about 20:1.

The flow rate of Ar<10 sccm and the flow rate He>100 sccm. Thus for example the He flow rate may be about 140 sccm and the Ar may be about 7 sccm.

In any of the above cases the metal may be copper.

In a further embodiment the method may be characterised in that the mix of He and Ar is such that the target current density is at least about 0.035 A/cm$^2$ and preferably about 0.037 A/cm$^2$.

Although the invention has been defined above it is to be understood it includes any inventive combination of the features set out above or in the following description.

BRIEF DESCRIPTION OF THE DRAWINGS

The invention may be performed in various ways and specific embodiments will now be described by way of example with reference to the accompanying drawings in which.

DETAILED DESCRIPTION

In an unbalanced DC Magnetron Ionised sputtering deposition system, metal and gas ionisation is achieved through the collision of metal and gas atoms with secondary electrons produced at the target surface. The secondary electrons are accelerated by the negative bias supply to the target surface and achieve high energies, typically 200 to 1000 eV. These high energy secondary electrons collide with metal and gas atoms or molecules and produce ions. Accordingly if the amount of secondary electrons emitted from the target could be increased then there would be an increase in the ionisation fraction that is the ratio of ions to neutrals from any species.

Figure 2:
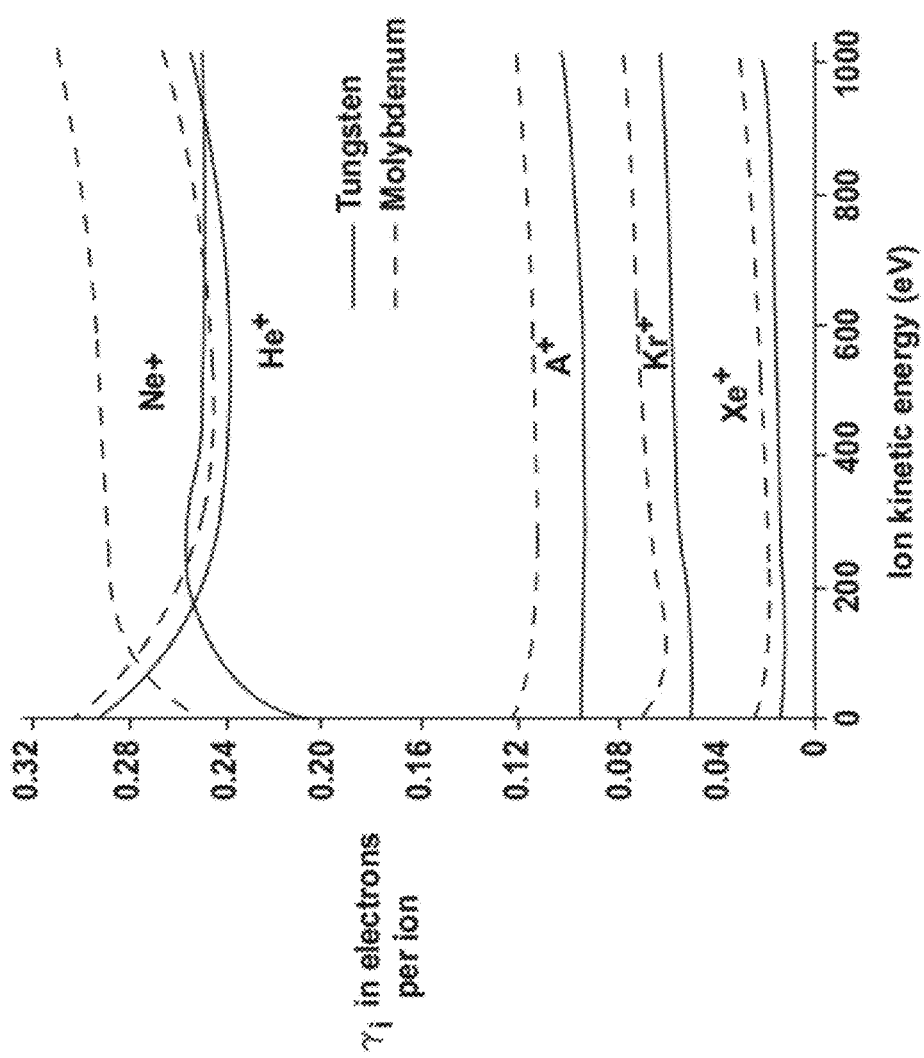
FIG. 2 is a table showing a secondary electron emission as a function of bombarding energy and gas types for ions incident on Mo and W targets. This figure is taken from Glow Discharge Processes, Chapmen, Wiley and Sons 1980.
Figure 3:
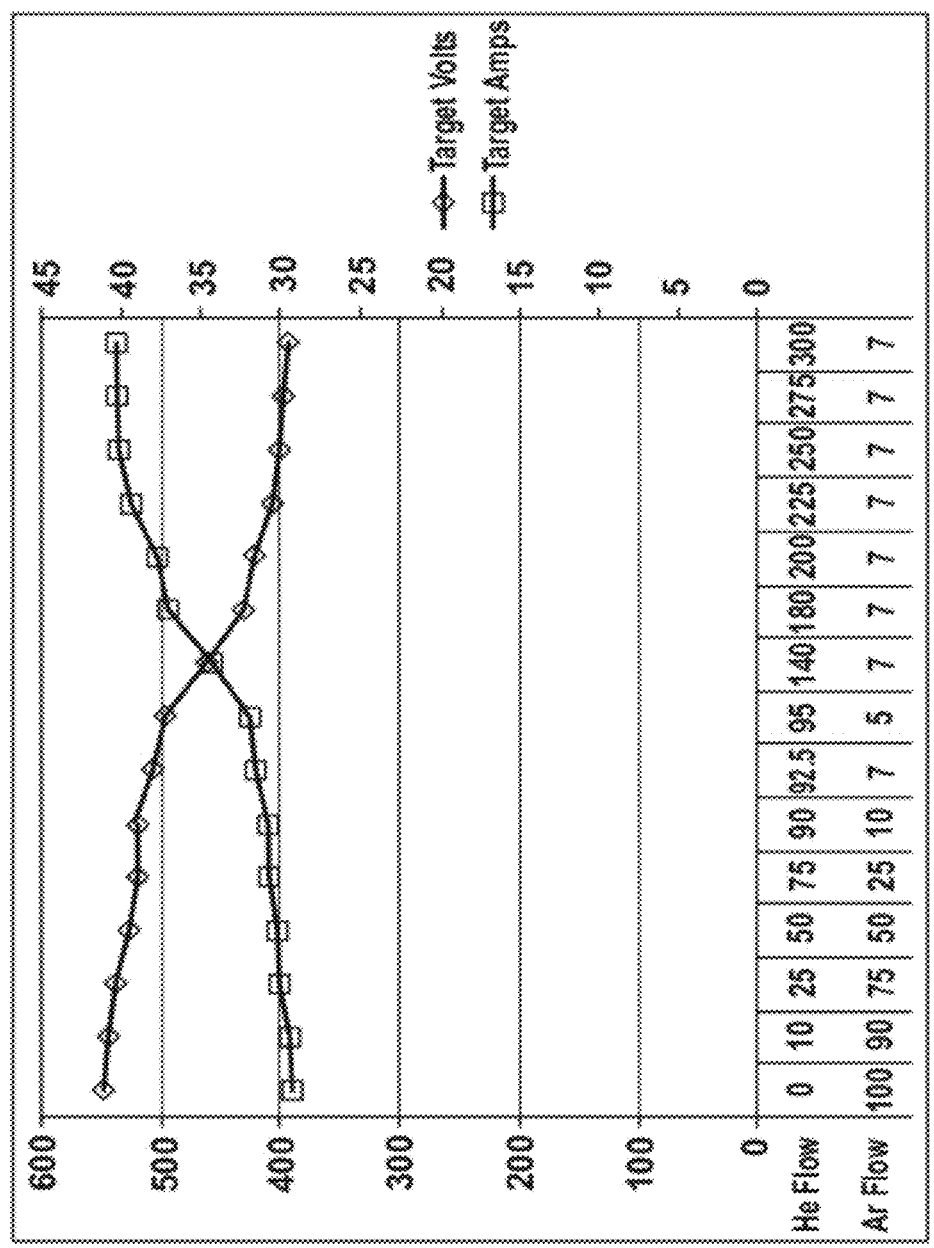
FIG. 3 illustrates the variation in target current and voltage with respective flow rates by adding He to the Ar sputter process.

As can be seen from FIG. 2, the secondary electron characteristics for various sputter gasses vary depending on the sputter gasses used. Thus He and Ne have higher levels of secondary electron emission as compared to heavier gasses such as Ar and Kr. The Applicants therefore appreciated that sputtering with He or Ne instead of Ar was likely to result in more secondary electrons emitted from the target and hence ionisation fraction.

This effect has been investigated by the Applicants by progressively introducing increased levels of helium flow and reducing the argon flow using a copper target and it would be seen that as the He is increased and the Ar is reduced the current increases due to formation of secondary electrons at the target surface. The presence of a low level of argon was discovered to be necessary to maintain film density quality.

Experiments

The Applicants then carried out an experiment using the apparatus of FIG. 1 with the process condition shown in Table 1 below.

TABLE 1

| Parameter | Std process | He/Ar process |
| --- | --- | --- |
| DC Power (kW) | 16 | 16 |
| Upper coil (A) | 15 | 15 |
| Lower coil (A) | 7 | 10.5 |
| Ar (sccm) | 100 | 7 |
| He (sccm) | 0 | 140 |
| Pressure (mT) | 5.97 | 5.02 |
| RF bias power (W) | 335 | 500 |
| Platen DC bias (V) | 245 | 275 |

Figure 1:
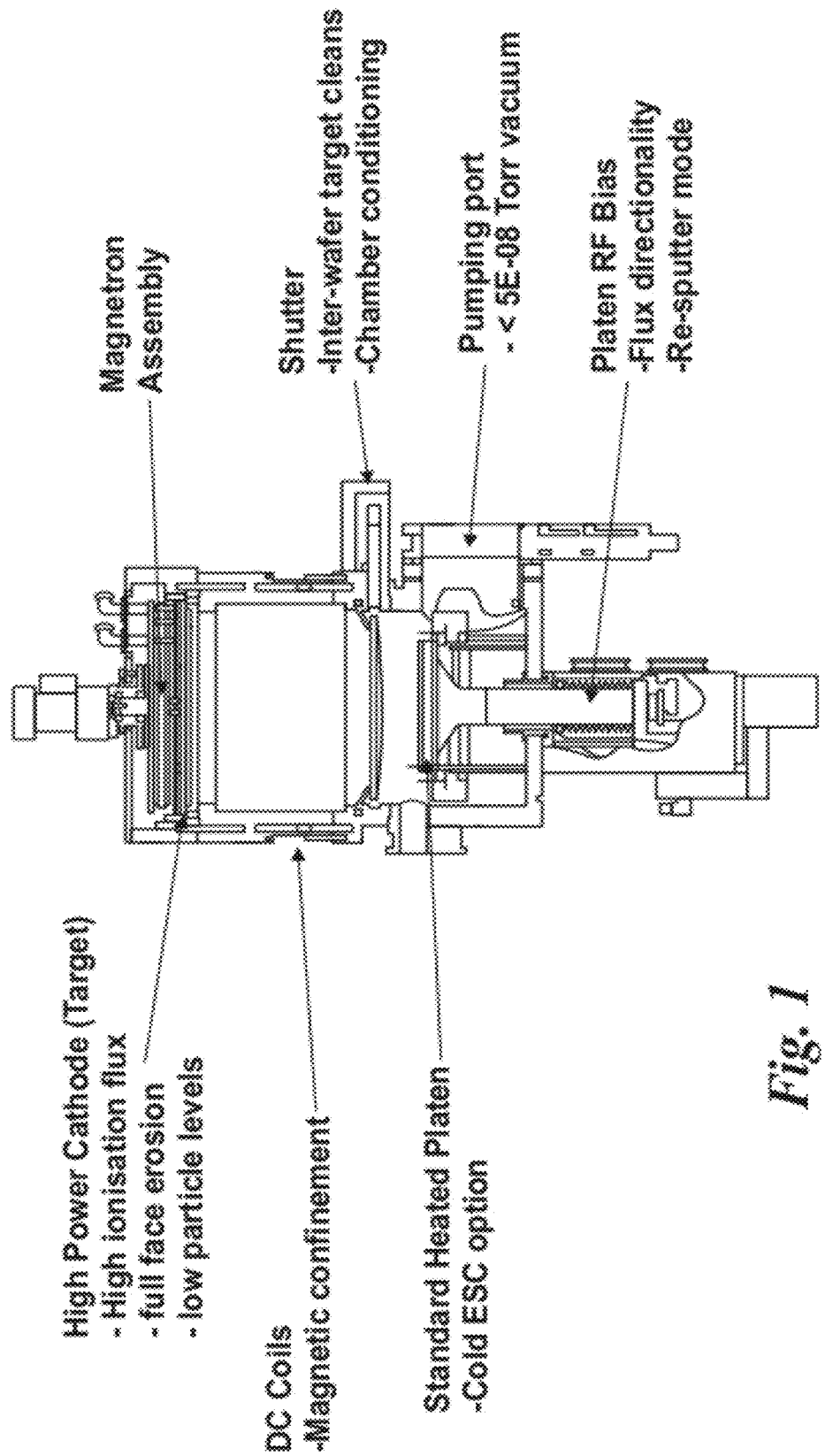
FIG. 1 is a cut away view of a DC magnetron ionised deposition sputtering system.
Figure 4:
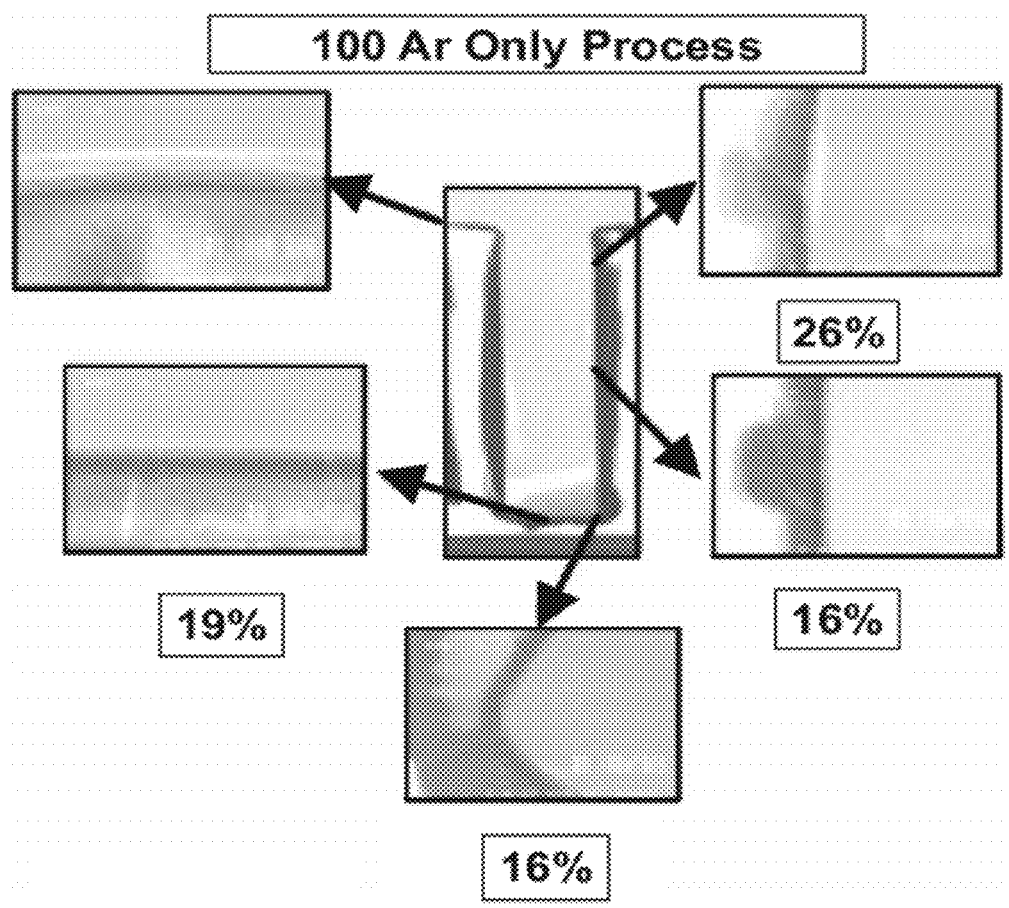
FIG. 4 shows the sidewall coverage in a 5:1 trench structure for a standard Ar process.
Figure 5:
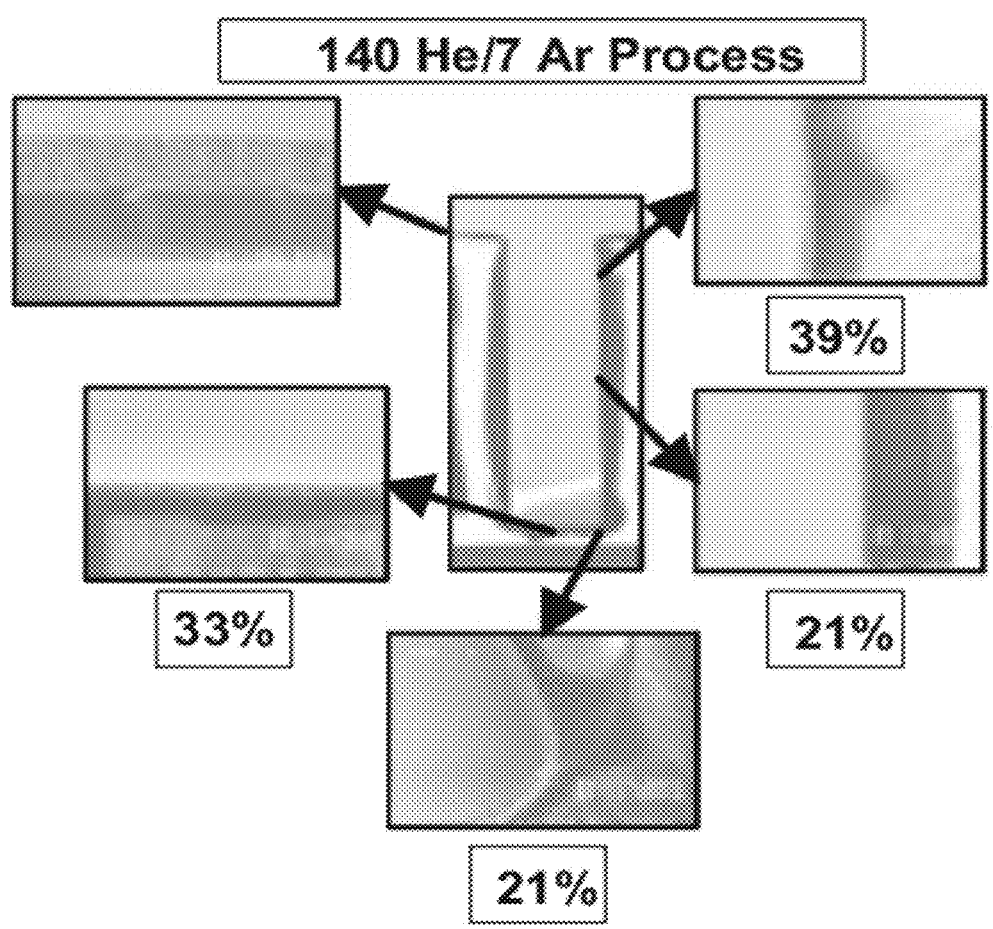
FIG. 5 shows the equivalent view to FIG. 4 for an optimised He/Ar process.

This compared a standard argon only process run on the apparatus of FIG. 1 and an He/Ar process where the Ar flow was 7 sccm whereas the He flow was 140 sccm. The resultant coverage for the first process is shown in FIG. 4, whilst for the second process the coverage is illustrated in FIG. 5. The resultant step coverage is summarised in Table 2 below.

It will be seen that the He/Ar process shows a 5% absolute, 30% proportional, increase in sidewall coverage over the Ar only process value.

It can be seen from Table 1 that the platen DC bias is increased by only 30V (12%) with the He/Ar process, despite the RF power applied to the platen having been increased by 165 W (50%) compared with the Ar only (standard) process. This shows that the He/Ar process has a higher level of ionisation, since the positive ions in the plasma will tend to reduce the negative DC bias achieved at the platen.

Figure 6:
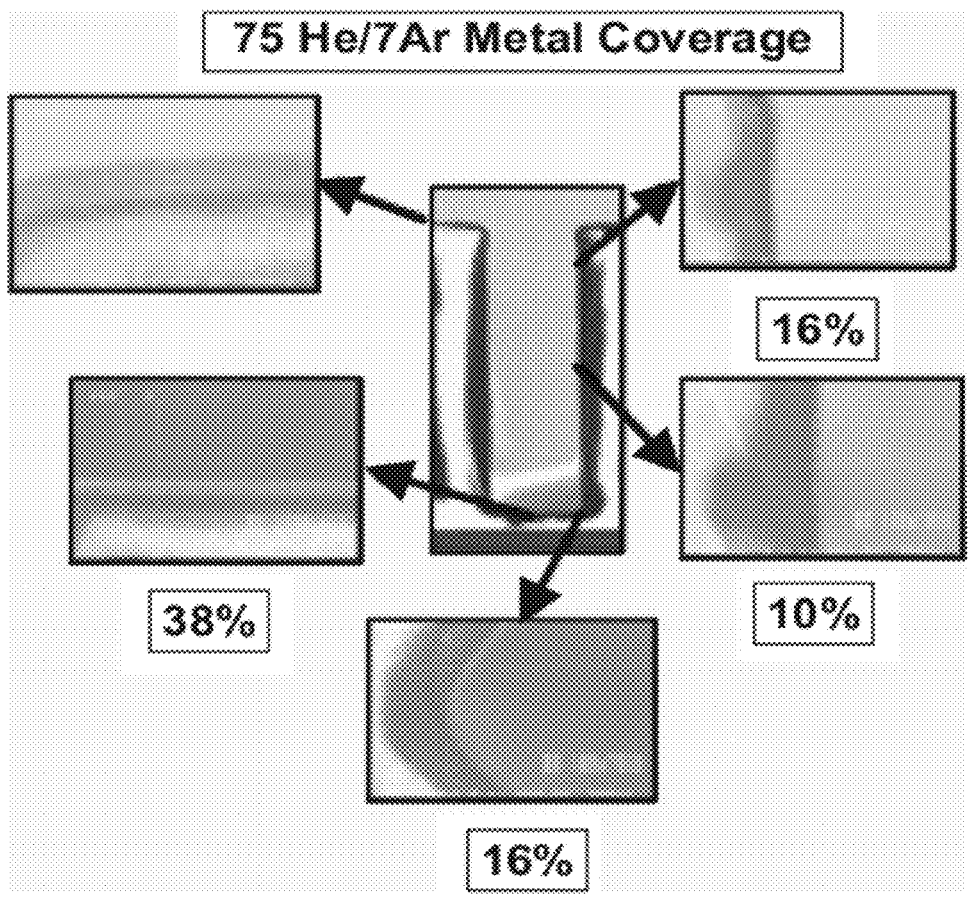
FIG. 6 is an equivalent view for an He/Ar process with a reduced He flow.

In FIG. 6 the same process was run but this time with a 75 He sccm flow and the results are summarised in Table 3 below.

TABLE 2

140 He/7 Ar Step Coverage using SEM

| Measurement Position | Thickness (nm) | Coverage (%) |
|---|---|---|
| Field | 360 | 100 |
| Sidewall - Top | 141 | 39 |
| Sidewall - Middle | 75 | 21 |
| Sidewall - Bottom | 75 | 21 |
| Base | 120 | 33 |

TABLE 3

75 He/7 Ar Step Coverage using SEM

| Measurement Position | Thickness (nm) | Coverage (%) |
|---|---|---|
| Field | 360 | 100 |
| Sidewall - Top | 56 | 16 |
| Sidewall - Middle | 35 | 10 |
| Sidewall - Bottom | 58 | 16 |
| Base | 136 | 38 |

From this it will be seen that reducing the He flow results in reduced sidewall coverage both as compared to the 140 He/7Ar process and the Ar only process. This is because in this experiment the secondary electrons produced in the plasma were reduced due to the lower He flow.

Experiments have shown that <10 Sccm Ar is required to maintain the plasma and allow the sputtering of the Cu target to occur. Conversly He flows >100 Sccm are required to help maintain the plasma and provide additional secondary electrons to enhance the sputtering effect at the bottom of the structure and so improve sidewall coverage.

Figure 6A:
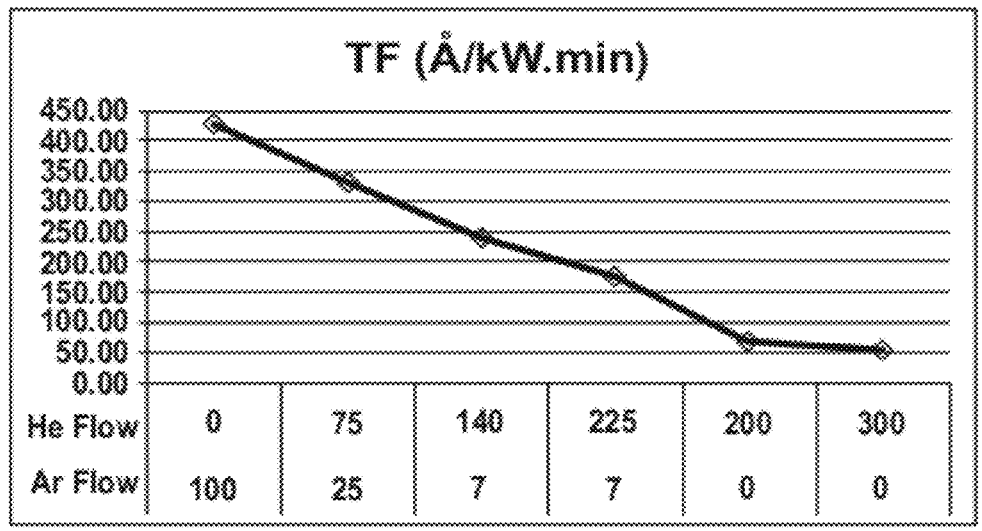
FIG. 6(a), (b), (c) show the effects of He/Ar flow on deposition rate (tooling factor); stress and within wafer non uniformity respectively.
Figure 6B:
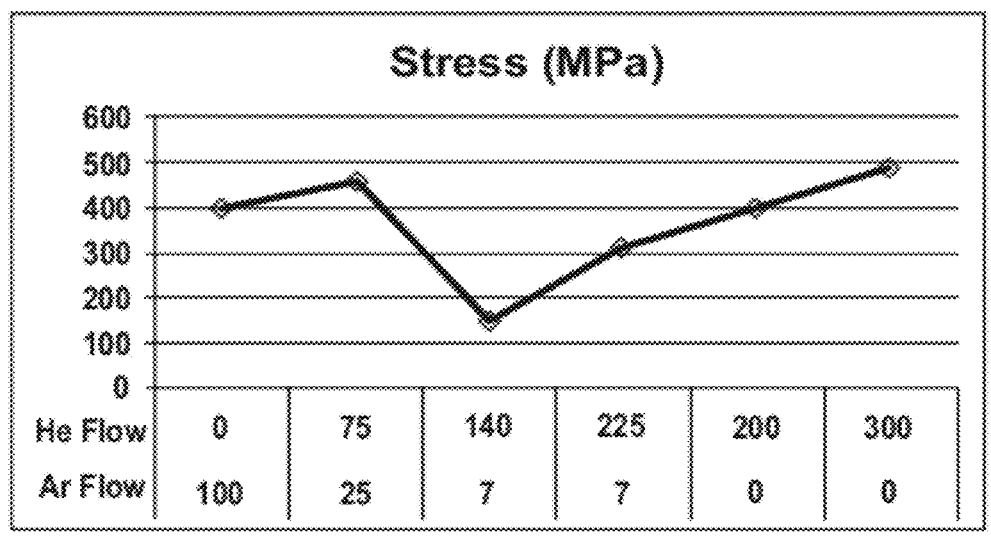
Figure 6C:
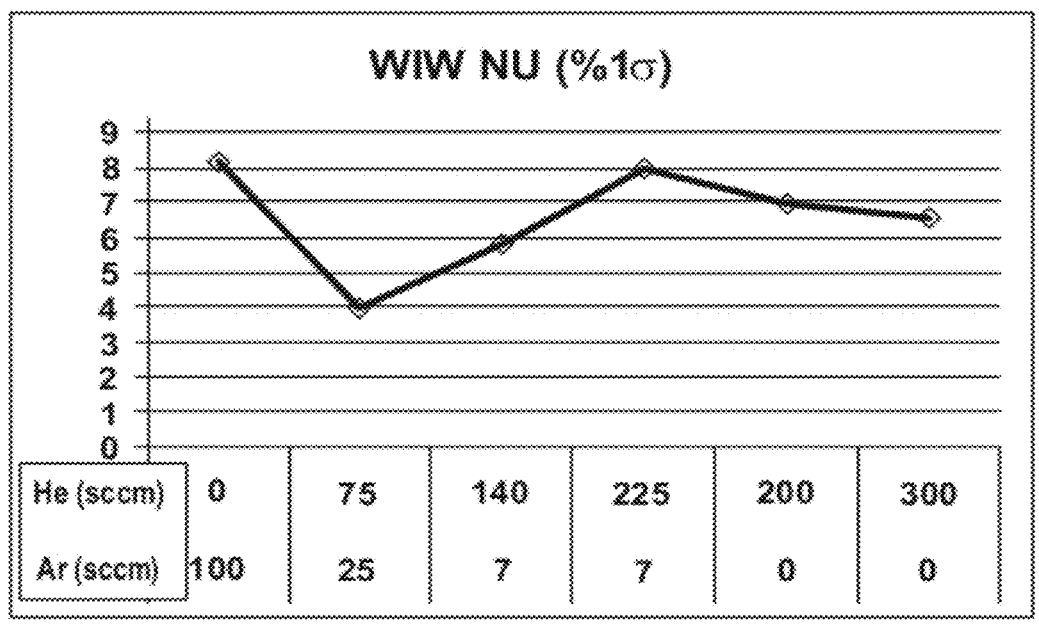

In further experiments the deposition rate stress and within wafer non uniformity were monitored with varying flows and the results are shown respectively in FIGS. 6A to C. It will be seen that although the deposition rate drops with the addition of He the 7Ar/140He process is still high enough from production purposes. This combination has a particularly good stress value and an exceptable uniformity. It will be appreciated that reduced film stress helps to prevent delamination of the Cu film from the underlying materials.

Figure 7:
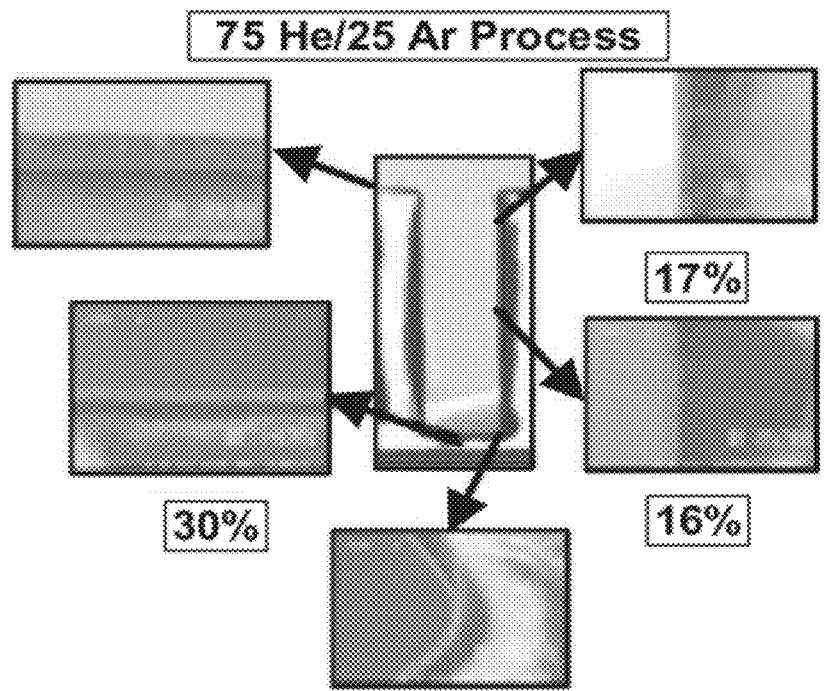
FIG. 7 is an equivalent view to FIG. 5 with another He recipe.

FIG. 7 illustrates a reduced helium flow with an increased argon flow and again the step coverage is reduced as is shown in Table 4 below.

TABLE 2

140 He/7 Ar Step Coverage using SEM

| Measurement Position | Thickness (nm) | Coverage (%) |
|---|---|---|
| Field | 360 | 100 |
| Sidewall - Top | 141 | 39 |
| Sidewall - Middle | 75 | 21 |
| Sidewall - Bottom | 75 | 21 |
| Base | 120 | 33 |

TABLE 4

75 He/25 Ar Step Coverage using SEM

| Measurement Position | Thickness (nm) | Coverage (%) |
|---|---|---|
| Field | 372 | 100 |
| Sidewall - Top | 63 | 17 |
| Sidewall - Middle | 59 | 16 |
| Sidewall - Bottom | 56 | 15 |
| Base | 108 | 30 |

Accordingly in summary it is seen that considerable improvements can be achieved by having helium flow rates above about 100 sccm and argon flow rates below about 10 sccm. The 7Ar/140He resulted in a particularly preferred process for the reasons indicated above.

It may in fact be more generally applicable to speak about the partial pressures of the gases as these should relatively remain relative constant in terms of the performance achieved, whilst the actual flow rates may vary from chamber to chamber. Table 5 below sets out the equivalent partial pressures for the experimental flow rates.

TABLE 5

| Ar Flow (sccm) | He Flow (sccm) | TOTAL Pressure (mT) | Ar Partial Pressure (mT) | He Partial Pressure (mT) |
|---|---|---|---|---|
| 100 | 0 | 6.0 | 6.0 | 0.0 |
| 7 | 140 | 6.2 | 0.3 | 5.9 |
| 7 | 75 | 3.5 | 0.3 | 3.2 |
| 25 | 75 | 4.7 | 1.2 | 3.5 |

The metal used in the experiments was copper. The invention process would be similar for Titanium, Tantalum, Gold or Ruthenium.

What is claimed is:

1. A plasma physical vapor deposition method, comprising:
providing a workpiece having a recess therein, whereby the workpiece has a surface defining the bottom of the recess and surfaces defining sides of the recess;
depositing metal onto the surface defining the bottom of the recess and resputtering the metal deposited at the bottom of the recess onto the surfaces defining the sides of the recess by generating a plasma from a sputtering gas mixture of Ar and at least one of He and Ne wherein the ratio of the at least one of He and Ne to Ar is at least about 10:1, bombarding a target comprising the metal with the plasma to produce a vapor of the metal, and exposing the workpiece to the vapor.

2. The method as claimed in claim 1, wherein the ratio is about 20:1.

3. The method as claimed in claim 1, wherein the target and the workpiece are supported in a processing chamber, and the Ar is supplied into the processing chamber at a flow rate of less than 10 sccm and the at least one of He and Ne is/are supplied into the processing chamber at a flow rate of greater than 100 sccm while the metal is being deposited at the bottom of the recess and resputtered.

4. The method as claimed in claim 3, wherein the sputtering gas includes He and the He is supplied into the processing chamber at a flow rate about 140 sccm and the Ar is supplied into the processing chamber at a flow rate of about 7 sccm while the metal is being deposited at the bottom of the recess and resputtered.

5. The method as claimed in claim 4, wherein the workpiece is supported on a platen in the processing chamber, the target is supported in the processing chamber, and the exposing of the workpiece to the vapor comprises applying an RF bias power of to the platen 500 W that induces a DC bias of 275V across the platen.

6. The method as claimed in claim 1, wherein the workpiece is supported on a platen in a processing chamber, the target is supported in the processing chamber, and the exposing of the workpiece to the vapor comprises inducing a DC bias voltage across the platen.

7. The method as claimed in claim 1, wherein the metal is selected from the group consisting of Copper, Titanium, Tantalum, Gold and Ruthenium.

8. The method as claimed in claim 1, wherein the discharge current density of the plasma is 0.035 A/cm$^2$.

9. The method as claimed in claim 1, wherein a negative DC bias is applied to the target while the metal is being deposited at the bottom of the recess and resputtered.

* * * * *